(12) United States Patent
Reimann et al.

(10) Patent No.: US 12,153,101 B2
(45) Date of Patent: Nov. 26, 2024

(54) SENSOR CALIBRATION CIRCUIT

(71) Applicant: NXP USA, Inc., Austin, TX (US)

(72) Inventors: Klaus Reimann, Eindhoven (NL); Siamak Delshadpour, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 242 days.

(21) Appl. No.: 17/649,155

(22) Filed: Jan. 27, 2022

(65) Prior Publication Data

US 2023/0236267 A1 Jul. 27, 2023

(51) Int. Cl.
*G01R 33/00* (2006.01)
*G01R 33/07* (2006.01)

(52) U.S. Cl.
CPC ......... *G01R 33/0035* (2013.01); *G01R 33/07* (2013.01)

(58) Field of Classification Search
CPC .......................... G01R 33/0035; G01R 33/07; G01R 33/0041; G01R 33/075
See application file for complete search history.

(56) References Cited

U.S. PATENT DOCUMENTS

| | | | |
|---|---|---|---|
| 5,818,225 A | 10/1998 | Miekley et al. | |
| 6,008,643 A | 12/1999 | Mani et al. | |
| 6,154,027 A | 11/2000 | Alexander et al. | |
| 6,362,618 B1 | 3/2002 | Motz | |
| 6,483,301 B2 | 11/2002 | Kempe | |
| 7,437,260 B2 | 10/2008 | Ausserlechner et al. | |
| 7,626,377 B2 | 12/2009 | Kilian et al. | |
| 7,855,554 B2 | 12/2010 | Oohira | |
| 7,980,138 B2 | 7/2011 | Ausserlechner | |
| 9,016,135 B2 | 4/2015 | Huber et al. | |
| 9,164,155 B2 | 10/2015 | Ausserlechner | |
| 9,410,820 B2 | 8/2016 | Ausserlechner | |
| 9,551,765 B2 | 1/2017 | Rohrer et al. | |
| 9,638,764 B2 | 5/2017 | Cesaretti et al. | |
| 9,766,300 B2 | 9/2017 | Motz et al. | |
| 9,791,521 B2 | 10/2017 | Butenhoff et al. | |
| 9,846,204 B2 | 12/2017 | Huber et al. | |
| 9,851,417 B2 | 12/2017 | Kosier et al. | |
| 9,857,247 B2 | 1/2018 | Huber et al. | |
| 9,864,038 B2 | 1/2018 | Fujita et al. | |

(Continued)

FOREIGN PATENT DOCUMENTS

| CN | 105607018 B | 5/2019 |
|---|---|---|
| JP | 2008-281374 A | 11/2008 |
| JP | 2014-048237 A | 3/2014 |

OTHER PUBLICATIONS

"Hall Effect Sensor", Electronics Tutorials, 11 pgs., retrieved from the internet Jan. 24, 2021 at: https://www.electronics-tutorials.ws/electromagnetism/hall-effect.html.
Meer, van der J.C. et al. "CMOS quad spinning-current Hall-sensor system for compass application", IEEE Sensors, pp. 1434-1437 (2004).
Kayal, M. et al. "Automatic calibration of Hall sensor microsystems", Microelectronics Journal 37, pp. 1569-1575 (2006).

(Continued)

*Primary Examiner* — Alvaro E Fortich

(57) ABSTRACT

One example discloses a sensor calibration circuit, including: a controller configured to transmit a first modulation signal to the sensor and receive a first output signal from the sensor in response; wherein the controller configured to transmit a second modulation signal to the sensor and receive a second output signal from the sensor in response; and wherein the controller is configured to calibrate the sensor based on the first and second modulation signals and the first and second output signals.

18 Claims, 7 Drawing Sheets

(56) References Cited

U.S. PATENT DOCUMENTS

| | | | |
|---|---|---|---|
| 10,001,529 B2 | 6/2018 | Polley et al. | |
| 10,069,065 B2 | 9/2018 | Polley et al. | |
| 10,438,835 B2 | 10/2019 | Motz | |
| 10,698,066 B2 | 6/2020 | Polley et al. | |
| 2011/0170339 A1* | 7/2011 | Wunderlich | G11C 11/16 365/158 |
| 2014/0163911 A1* | 6/2014 | Rohrer | G01R 33/075 324/251 |
| 2015/0070007 A1* | 3/2015 | Kurniawan | G01R 33/0023 324/251 |
| 2015/0115937 A1* | 4/2015 | Fujita | G01R 33/07 324/207.12 |
| 2015/0301149 A1* | 10/2015 | Cesaretti | G01R 35/005 324/202 |
| 2016/0124055 A1* | 5/2016 | Ausserlechner | G01R 33/075 324/251 |
| 2017/0030983 A1* | 2/2017 | Crescentini | G01R 33/0206 |
| 2017/0146621 A1* | 5/2017 | Freytag | G01R 33/4641 |
| 2017/0288131 A1* | 10/2017 | Sun | H10N 52/01 |
| 2018/0172779 A1 | 6/2018 | Stahl-Offergeld | |
| 2018/0231620 A1* | 8/2018 | Bruna | H10N 52/101 |
| 2019/0139760 A1* | 5/2019 | Fuhrer | H10K 10/46 |
| 2022/0155352 A1* | 5/2022 | Cheskis | G01R 15/20 |

OTHER PUBLICATIONS

Motz, M. et al. "An Integrated Magnetic Sensor with Two Continuous-Time ΔΣ-Converters and Stress Compensation Capability", IEEE ISSCC—Digest of Technical Papers / Session 16 / MEMS and Sensors / 16.6, 10 pgs. (2006).

Pastre, M. et al. "A Hall Sensor Analog Front End for Current Measurement With Continuous Gain Calibration", IEEE Sensors Journal, vo. 7, No. 5, pp. 860-867 (May 5, 2007).

Mikinwa, K. A.A. et al. "Smart Sensor Design: The Art of Compensation and Cancellation", IEEE ESSCIRC 2007—33rd European Solid-State Circuits Conference, pp. 76-82 (Jan. 14, 2008).

Huber, S. et al. "Package Stress Monitor to Compensate for the Piezo-Hall Effect in CMOS Hall Sensors", IEEE Sensors Journal, vol. 13, No. 8, pp. 2890-2898 (Aug. 2013).

Zieren, V. et al. "MOS-gated Bipolar Magnetotransistors for 360° Angular Sensing", IEEE Sensors 2014, 4 pgs., (2014).

Jiang, J. et al. "11.3 A hybrid multipath CMOS magnetic sensor with 210µTrms resolution and 3MHz bandwidth for contactless current sensing", IEEE International Solid-State Circuits Conference, 3 pgs., (2016).

Chang, T. et al. "CMOS Hall Sensor with Reduced Sensitivity Drift by Synchronous Excitation Calibration for Wearable Biomagnetic Sensor in System-on-Chip", IEEE Sensors, 3 pgs., (2016).

* cited by examiner

SENSOR CALIBRATION CIRCUIT

The present specification relates to systems, methods, apparatuses, devices, circuits, articles of manufacture and instructions for sensor calibration.

SUMMARY

According to an example embodiment, a sensor calibration circuit, comprising: a controller configured to transmit a first modulation signal to the sensor and receive a first output signal from the sensor in response; wherein the controller configured to transmit a second modulation signal to the sensor and receive a second output signal from the sensor in response; and wherein the controller is configured to calibrate the sensor based on the first and second modulation signals and the first and second output signals.

In another example embodiment, the controller is configured to calibrate a drift of the sensor based on the first and second modulation signals and the first and second output signals.

In another example embodiment, the controller is configured to calibrate a detection sensitivity of the sensor based on the first and second modulation signals and the first and second output signals.

In another example embodiment, the modulation signals vary a charge carrier density within the sensor.

In another example embodiment, calibration of the sensitivity is based on variations in the charge carrier density.

In another example embodiment, the controller is configured to calibrate the sensor based on a mechanical stress ($\sigma$) equation; the equation is $\sigma=[wj(T)*Voutj]$; the first and second modulation signals correspond to j=1 and j=2 in the equation; the first and second output signals correspond to Voutj; and w is a weighting factor based on temperature (T).

In another example embodiment, the sensor is configured to receive the modulation signals at a back-bias electrode.

In another example embodiment, the sensor is configured to receive the modulation signals at a gate electrode.

In another example embodiment, the sensor is configured to receive the modulation signals at an input voltage electrode In another example embodiment, the sensor is configured to receive the modulation signals at an input current electrode.

In another example embodiment, the sensor is a magnetic sensor.

In another example embodiment, the sensor is a Hall-Effect sensor; and the output signals are Hall-Voltages (VH).

In another example embodiment, the controller is configured to generate the two Hall-Voltages (VH) by varying a bias voltage applied to a back-bias electrode coupled to the Hall Sensor.

In another example embodiment, the controller is configured to generate the two Hall-Voltages (VH) by varying an input voltage (Vs) applied to the Hall Sensor.

In another example embodiment, the controller is configured to generate the two Hall-Voltages (VH) by varying an input current (Is) applied to the Hall Sensor.

In another example embodiment, the controller is configured to calculate a magnetic flux density (B), a temperature (T), and a mechanical stress ($\sigma$) of the Hall-Effect sensor from the Hall-Voltages (VH).

In another example embodiment, the controller is configured to send the modulation signals to the Hall-Effect sensor during a Hall-Effect sensor calibration phase.

In another example embodiment, the controller is configured to turn off the modulation signals during a Hall-Effect sensor operational phase.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
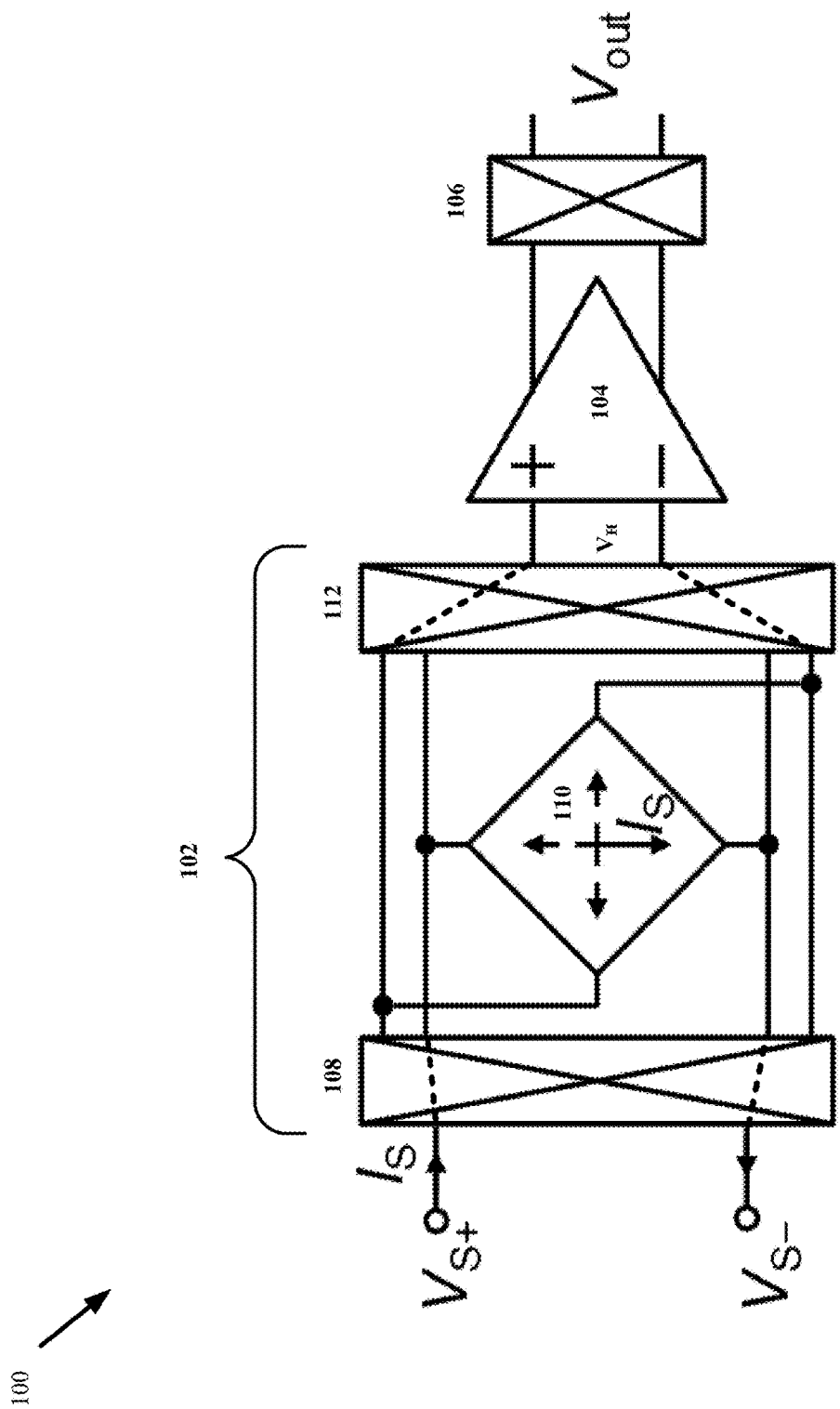
FIG. 1 represents an example of a Hall-Effect sensor circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Sensors of various types are ubiquitous in many industrial and consumer applications. Sensors are often a critical data gathering element not only for convenience purposes, but often for many safety critical applications. Ensuring that such sensors are initially and periodically calibrated ensures their accuracy in these various applications.

In many example applications, sensor offset drift and sensor sensitivity errors and/or deviations are causally related to sensor temperature and mechanical stress. This is particularly true for magnetic sensors. Theoretical or empirical equations exist for calculating the sensor's response to magnetic flux density (B), temperature (T), and mechanical stress ($\sigma$). The magnetic flux density B can be determined once all other quantities are known. However, some of the input variables may be unknown or uncertain in practical cases Neglecting the influence of other factors than the magnetic field on the output value leads to an error or drift.

In some examples, temperature and mechanical stress can be measured with additional separate sensors to obtain additional measured quantities and thus a better estimate of the magnetic field. Such extra sensors draw power and require additional circuit area.

Such extra sensors often need to be placed beside the magnetic sensor. They thus may not measure the disturbing effects exactly at the sensor and are affected by gradients of temperature and stress. It may even be that the auxiliary sensors themselves cause errors by inducing stress or self-heating. When measured sequentially, time-varying disturbances may go undetected.

It is therefore beneficial to use quantities of the magnetic sensor itself to extract and compensate disturbing effects. For example, the sensor resistance can be used to determine the sensor's temperature. The sensor resistance is also sensitive to mechanical stress. Combining the sensor resistance and an additional temperature sensor could thus be used for (partial) stress compensation. however such absolute resistance measurements are difficult and must themselves also be very accurate an stable over lifetime (i.e. they have their own calibration errors).

The following discussion will now focus on magnetic sensors, as just one type of sensor needing calibration. Those skilled in the art will recognize that the teachings of this specification may be applied to other sensors as well.

Magnetic sensors are often solid state devices and are becoming more and more popular because they can be used in many different types of application such as sensing position, velocity or directional movement. They are also a popular choice of sensor for the electronics designer due to their non-contact wear free operation, their low maintenance, robust design and as sealed Hall-Effect devices are immune to vibration, dust and water.

Magnetic sensors are designed to respond to a wide range of positive and negative magnetic fields (e.g. North and South polarities) in a variety of different applications.

Hall-Effect sensors are one type of magnet sensor whose output signal is a function of magnetic field density around it. Hall-Effect sensors are devices which respond to an external magnetic field. Magnetic fields are characterized by their magnetic flux density (B) and orientation. A single Hall sensor is sensitive to only one orientation of the magnetic field, e.g. only to fields pointing towards the North or South Pole. When a Hall-Effect sensor is placed within a magnetic field, the magnetic flux lines exert a (Lorentz-)force on moving charge carriers within the semiconductor material. The charge carriers, electrons and holes, are consequently deflected to either side of the conduction path. The resulting charge-build-up can be measured as the sensor's Hall-voltage ($V_H$). on electrodes perpendicular to the current path.

The Hall Voltage is directly proportional to the strength of the magnetic flux density (B) passing through the semiconductor material. This output voltage can be quite small for silicon-based devices, only a few micro-Volts even when subjected to strong magnetic fields. Most commercially available Hall-Effect devices based on silicon semiconductors are thus manufactured with built-in DC amplifiers, analog-digital-converters (ADCs) logic switching circuits, current and voltage regulators to improve the sensor's sensitivity and output voltage. This also allows the Hall-Effect sensor to operate over a wider range of power supplies and to interface directly with micro-controllers, which is common in many modern applications.

FIG. 1 represents an example 100 of a Hall-Effect sensor circuit. The example circuit 100 includes a spinning circuit 102, an amplifier 104 and an output switch 106. The spinning circuit 102 includes an input switch 108, a Hall-Effect sensor 110, and an output switch 112.

A Hall-Effect sensor 110 magnetic field offset is compensated by a spinning current operation. In the spinning current operation, the input switch 108, output switch 112 and wires shown coupled to the Hall-Effect sensor 110 are rotated cyclically such that a supply current (Is) "spins" in all contact orientations. One example spin-coupling is shown by the dashed lines. The output voltage of the Hall-Effect sensor 110 is available on the contacts that do not carry the supply current (Is). It is applied to a typically chopper-stabilized amplifier 104 via switches 112. The offset of the sensor 110 is cancelled by averaging the output voltage over all spinning phases, which may happen after the output 106 (not shown in this figure). The "arrows" shown in the Hall-Effect sensor 110 indicate direction of the spinning current flow at the different times/phases. Switches 106 and 112 are used to suppress the offset of the amplifier by chopping (periodically inverting) the small Hall voltage signal.

The spinning currents are generated by applying a first current/voltage to one set of two pins on the Hall-Effect sensor 110 and then measuring a first output voltage ($V_H$); second by spinning the Hall-Effect sensor 110 pins by applying a second current/voltage to another set of two pins on the Hall-Effect sensor 110 and then measuring a second output voltage ($V_H$); and then averaging the two output voltage measurements to improve an overall accuracy of the Hall-Effect sensor 110.

Influence of mechanical stress on a sensitivity of the Hall-Effect sensor 110 depends on the orientation of the current (Is) with respect to the Hall-Effect sensor's 110 crystal axes. Choosing a suitable circuit layout and spinning the current (Is) helps remove anisotropic stress influences. However, an isotropic stress effect remains. The output voltage ($V_H$) of the Hall-Effect sensor 110 is proportional to $I_s/n$ where n is a charge carrier density within the Hall-Effect sensor 110, assuming a single carrier type. Even with a perfect current source (Is), there is a drift because n does (slightly) depend on temperature and mechanical stress. Additionally, the current source itself may also be affected by the same parameters.

Now discussed is a sensor calibration circuit that can be coupled to a sensor (e.g. a magnetic sensor, a Hall-Effect sensor, etc.) that can correct for various errors (e.g. drift and sensitivity errors) due to temperature, mechanical stress gradients, and other environmental and operational effects.

The a sensor calibration circuit uses sensor bias modulation to obtain additional sensor output data points that are causatively related to the sensor's drift and sensitivity dependence on temperature and mechanical stress. By measuring the sensor output signals under several input bias conditions, the effect of temperature and mechanical stress on the sensor can be calculated and then used for sensor offset and sensitivity calibration.

In some example embodiments, a useful implementation requires a device construction with enough effect of the modulation voltage (or a small bandwidth which may cause issues with cross-modulation of signal band). Also in various example embodiments, devices with a higher bias sensitivity also have a higher temperature dependence and likely a higher stress dependence.

For example embodiments using a magnetic sensor such as a Hall-Effect sensor, the modulated/bias parameter can be either a sensor back-bias, an input voltage (Vs) or current (Is), a gate-bias, and/or a sensor resistance bias. For example, a Hall-Effect sensor's absolute sensitivity is related to the sensor's internal charge carrier density which can be modulated with a back-bias signal. Such bias modulation can be made part of a spinning-current offset compensation loop in a Hall-Effect sensor based device.

In additional example embodiments, the modulated/bias parameter can be weighted by pulse width modulation or negative weights (e.g. inverting phase in chopper/demodulation switches). Additional extra input variables such as offset before spinning, resistance of the sensor, and/or a separate temperature sensor can also be used.

These additional modulation signals enable the three unknowns of magnetic flux density (B), temperature (T), and mechanical stress (σ) to be calculated from the output signals of the magnetic sensor itself. The temperature can be extracted, for example, from the supply load or output resistance of the sensor.

In many example embodiments, the modulation signal is not used to control the sensor's drift or sensitivity based on the input of external sensors that measure environmental variables such as temperature and mechanical stress. The modulation of the input signals is rather used to characterize the sensor's drift or sensitivity, reducing the need for additional environmental sensors. Sensor outputs signals in response to various modulation signals are then combined in a weighted manner to compensate drift of sensitivity or offset in the sensor.

Figure 2:
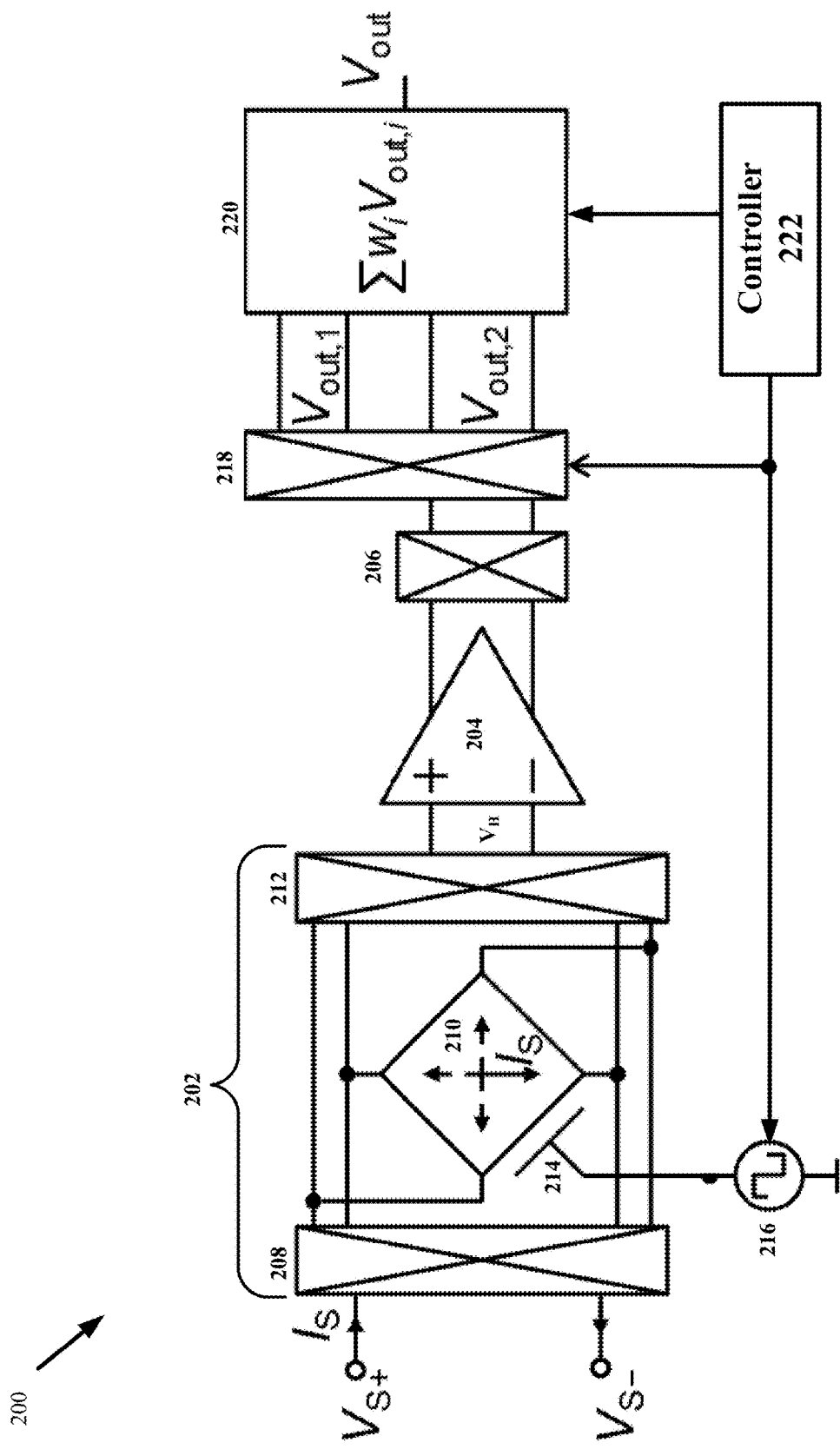
FIG. 2 represents a first example of a sensor calibration circuit.

FIG. 2 represents a first example 200 of a sensor calibration circuit. The example circuit 200 includes a spinning circuit 202, an amplifier 204 and an output switch 206. The spinning circuit 202 includes an input switch 208, a Hall-Effect sensor 210, and an output switch 212. In some example embodiments, the output switch 212 also acts as input chopper for amplifier 204. In other example embodiments, one may split the switch matrix 212 into two parts: the chopper and the spinning current switch. In still other example embodiments, switches 206 and 218 may be merged into a single switch matrix. The example circuit 200 further includes a bias electrode 214 (e.g. back-bias or gate-bias) coupled to the Hall-Effect sensor 210, a modulation generator 216, a demodulation switch 218, a summing/weighting circuit 220, and a controller 222.

The bias electrode 214 is configured to generate an electrostatic field within the Hall-Effect sensor 210 in response to a bias modulation signal from the modulation generator 216 in response to a command from the controller 222. The bias modulation signal modulates a charge carrier density within the Hall-Effect sensor 210. The charge carrier density is directly related to the sensor's sensitivity.

A depletion layer created within the Hall-Effect sensor 210 changes with the bias modulation signal and pushes out charge carriers. An ability of the modulation signal to modulate the charge carrier density is dependent upon a temperature as well as a mechanical stress of the Hall-Effect sensor 210 and thus provides the ability of the controller 222 in conjunction with the summing/weighting circuit 220 to magnetic flux density (B) with compensation of temperature (T), and mechanical stress (σ). It needs three independent signals because we have three initially unknown quantities that affect the sensor voltage ($V_H$). For example, The two sensor voltages at two different bias states, and the sensor resistance In other words, the output voltage ($V_H$) of the sensor at two different bias settings has a different dependence based on temperature on stress. Separate temperature and/or Hall-Effect sensor 110 internal resistance sensors can be added. These output voltages ($V_H$) are indirect but correlated to actual sensor drift and sensitivity which provide additional data points for calculating/curve fitting to obtain the three unknowns of magnetic flux density (B), temperature (T), and mechanical stress (σ) which then can be used for direct sensor drift and sensitivity compensation.

FIG. 2 shows how two of these three needed signals are separated by switch 218 and combined for compensation in unit 220. The third signal, for example the sensor voltage Vs as the constant current Is as measure for the temperature could be added as extra input to unit 220 or used in typical temperature-compensation after unit 220. By modulating both, Is (or Vs) and plate bias 214, one may even extract and process all three signals in the same signal chain as shown in FIG. 2.

The control input of switch 218 is coupled to line of controller 222 to bias generate 216. Implementation may be like shown (digital signals), but in alternate embodiments one may want to set different bias levels than the digital voltage level. Switch 218 separates the sensor output voltage at the different modulation states. It switches the amplified signal (after 206) towards $V_{out,1}$ in the first modulation state, and to $V_{out,2}$ in the second modulation state. The modulation and the switching can happen at a high frequency larger than the signal bandwidth, such that these voltages are almost simultaneously available at the input of stage 220.

One example equation for calculating a combined, compensated estimate for the magnetic flux density B is $B \approx \Sigma_i w_i(T) V_{out,i}$, where T is temperature, $w_i$ are a weighting factors for each of the separated output ($V_H$) voltages $V_{out,i}$. The weighting factors may be temperature-dependent. An estimator for the temperature T may be derived from the sensor resistance as measured by the supply voltage for a fixed supply current.

In other example embodiments, the modulation signal can be an input voltage or an input current to the Hall-Effect sensor 210. For example, the output voltage ($V_H$) scales with either the supply current ($I_S$) or the supply voltage ($V_S$). In such example embodiments, the weighting factors will likely be different from the back-bias and gate-bias example embodiments. Weighting can be performed with analog, digital, or mixed circuitry.

In some example embodiments, the modulation signals can be generated by a spinning-current offset compensation loop coupled to the Hall-Effect sensor 210.

In some example embodiments, the modulation signals selected by the controller 222 are arbitrary and selected primarily to enable calibration of the sensor to be more accurately calculate the magnetic flux density (B), temperature (T), and mechanical stress (σ) parameters of the sensor (e.g. better curve fitting). Since the modulation signals can be arbitrary, the controller can be configured to send the modulation signals to the sensor only during a sensor calibration phase, and not during a sensor operational phase.

However, the sensor calibration circuit 200 requires little extra power and area and may be operated continuously during operation. For example, the demodulation switch 218 is small and the modulation generator 216 can be integrated with a chopping/spinning generator. Further, the summing/weighting circuit 220 can be embedded in an analog circuit (e.g. weighted amplifier, PWM, etc.) or in a digital circuit (e.g. in a part of the ADC or after conversion by an ADC).

A simple weighting is averaging of the output voltages during the different modulation stages by duty cycling ("PWM"). In this very simple case, the switch matrix 218 can be omitted or simplified. The output signal would just be averaged, as is already the case for the spinning current scheme. The weighting factors are the just proportional to the time that a modulation state is active. For example, If one wants to calculate $V_{out}=0.25\ V_{out,1}+0.75\ V_{out,2}$, then the controller 222 can generate a digital signal that has a duty cycle of 25%. The bias generator 216 would provide a first bias voltage to electrode 214 during 25% of a full cycle and a second bias voltage for 75% of the period. The first and second output voltage are then averaged by the combining unit 220. Negative weights are possible by inverting the output signal for one bias state either in the chopper switches 206 or a separate switch 218.

Another simple implementation for fixed weights are to integrate weighting resistors or capacitors into the separation/de-modulation switch matrix 218. The output signals could be just be summed up with a resistor network.

These networks of capacitors or resistors may be adjusted by controller 222, e.g. to make them temperature dependent. The same can be done in the duty-cycling scheme.

The above schemes are very area and power efficient. There is very little overhead over the state-of-the-art Hall sensors with spinning current as shown in FIG. 2.

Other implementations are possible: first converting the separated signals into the digital domain and then do a post-processing of the data in the digital domain or even in a remote microcontroller. This allows very flexible, complicated and non-linear combinations.

In some example embodiments a statistical approach may be used to calculate the weights for a full population of sensors (not an individual calibration) and may be employed during development of a sensor or at fab-calibration. In alternate embodiments, the weighting factors can be determined experimentally. They may be chosen the same over a full production or they can be trimmed individually per sensor. The most flexible is to make them programmable. Then several settings can be tried to find the best performing setting.

Figure 3:
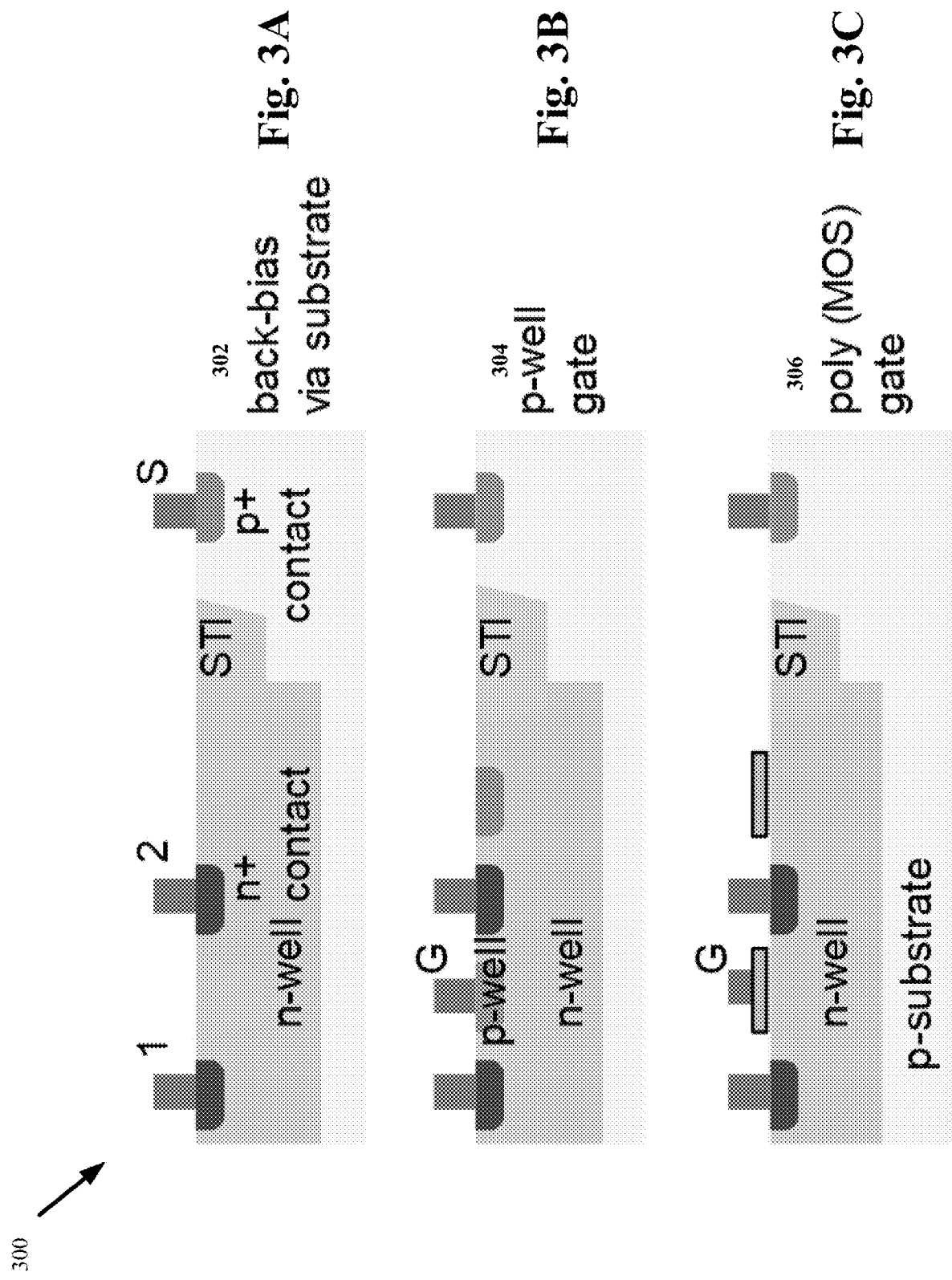
FIG. 3A represents a second example of the sensor calibration circuit.
FIG. 3B represents a third example of the sensor calibration circuit.
FIG. 3C represents a fourth example of the sensor calibration circuit.

FIG. 3A represents a second example of the sensor calibration circuit 302. In the second circuit 302, a back-bias electrode is formed by a p+ well coupled to electrode "S" on a die next to the Hall-Effect sensor 210.

FIG. 3B represents a third example of the sensor calibration circuit 304. In the third circuit 304, a gate-bias electrode is formed by a p+ well coupled to electrode "G" within the Hall-Effect sensor 210 on a die.

FIG. 3C represents a fourth example of the sensor calibration circuit 306. In the fourth circuit 306, a gate-bias electrode is formed by a MOSFET-type structure coupled to electrode "G" within the Hall-Effect sensor 210 on a die.

Figure 4:
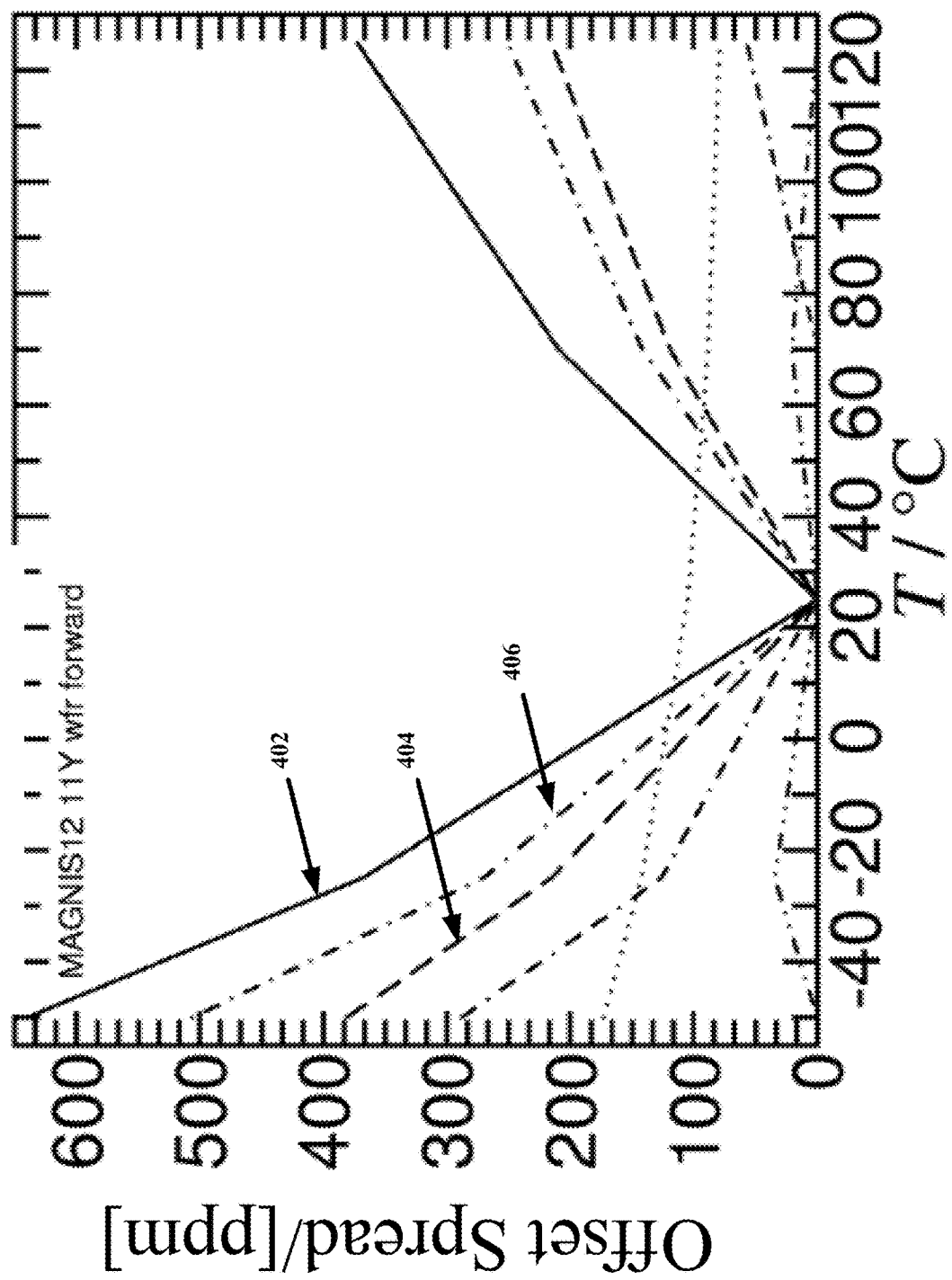
FIG. 4 represents an example graph of how properties of a magneto transistor sensor can vary based on temperature and how bias modulation reduces these effects.

FIG. 4 represents an example graph of how the temperature drift of the offset of a magneto transistor sensor can be reduced by bias modulation and a compensation scheme as disclosed in this document. The description in this document takes the Hall sensor as an example. A magneto-transistor uses the same sensor principle of the Lorentz-force. The output signal is in this case a difference current, which is equivalent to the Hall voltage of a Hall sensor. In this example, the magneto transistor has a gate above the sensitive base region. The y-axis plots the spread of the random relative offset over a population of different samples. The offset is calibrated at a single temperature of 25° C. However, devices show a random distribution of different temperature drift due to manufacturing tolerances. Shown are the results of the proposed compensation scheme for a fixed bias 402, an emitter current modulation 404, and a gate voltage variation 406. Fixed, device independent weighting factors allow the reduction of this offset spread, even without an individual device calibration at several temperatures.

Figure 5:
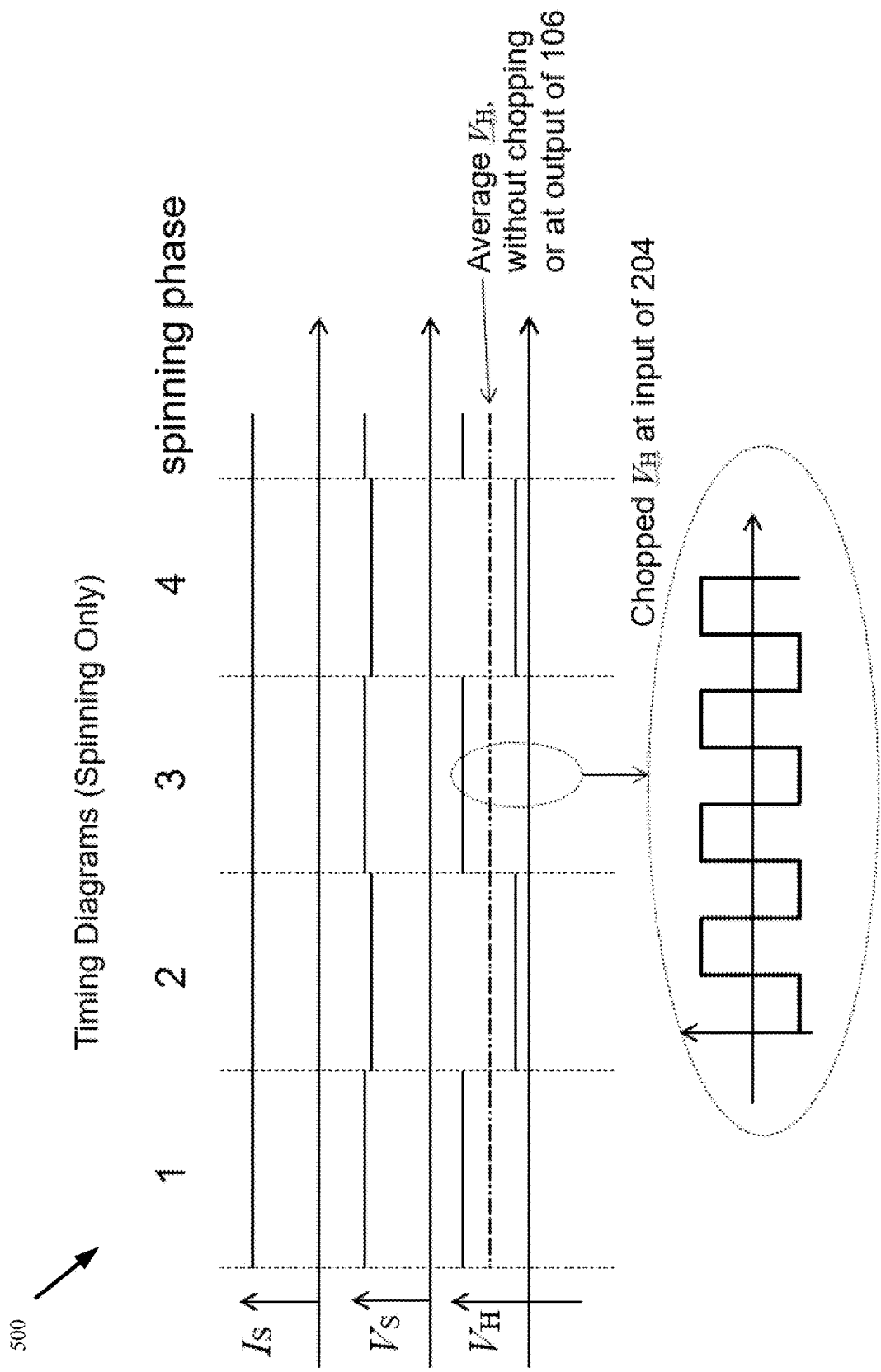
FIG. 5 represents a first operational timing diagram of the sensor calibration circuit.

FIG. 5 represents a first operational timing diagram 500 of the sensor calibration circuit. The first timing diagram 500 shows spinning only operation.

Figure 6:
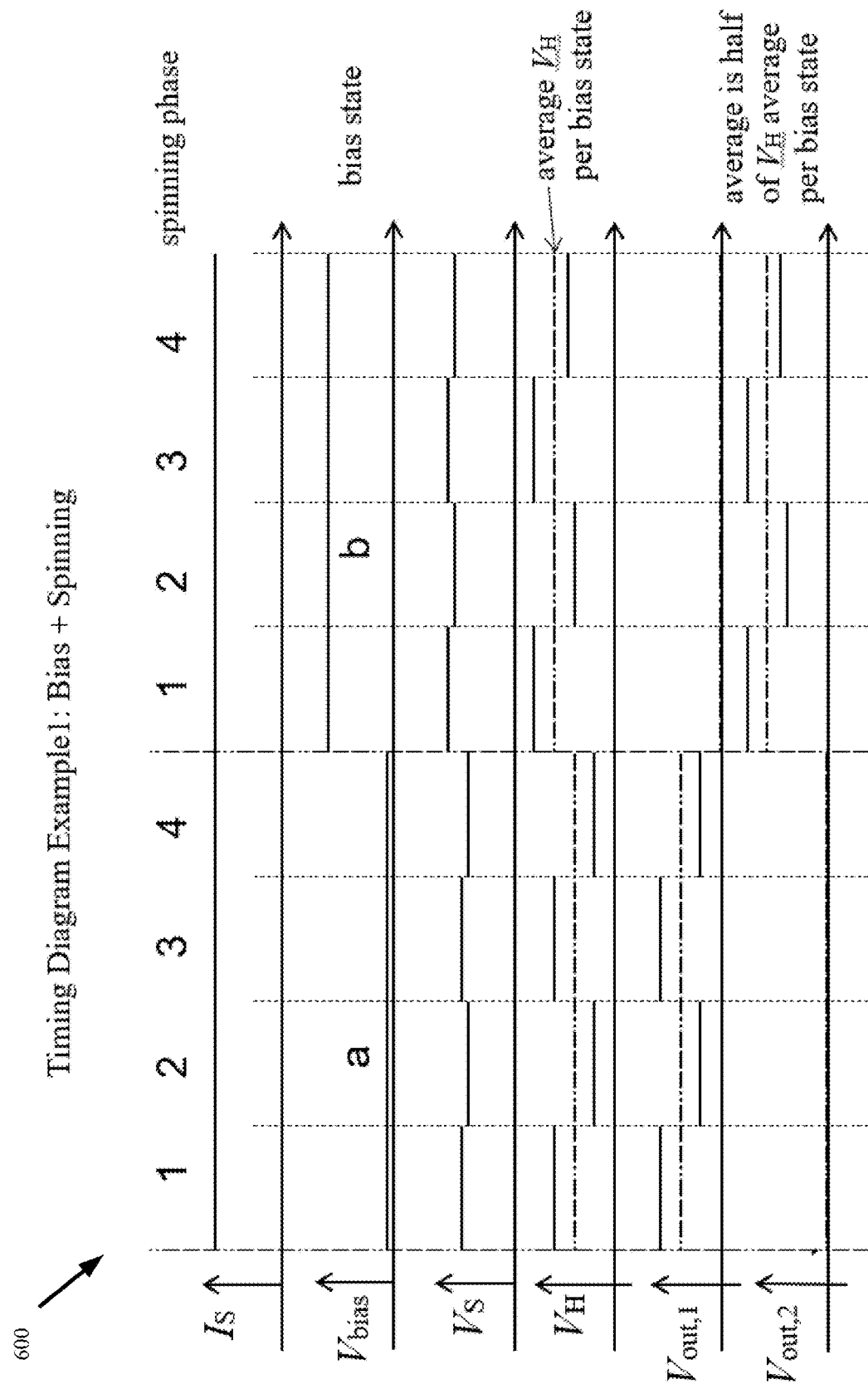
FIG. 6 represents a second operational timing diagram of the sensor calibration circuit.

FIG. 6 represents a second operational timing diagram 600 of the sensor calibration circuit. The second timing diagram 600 shows a first example of bias plus spinning operation.

Figure 7:
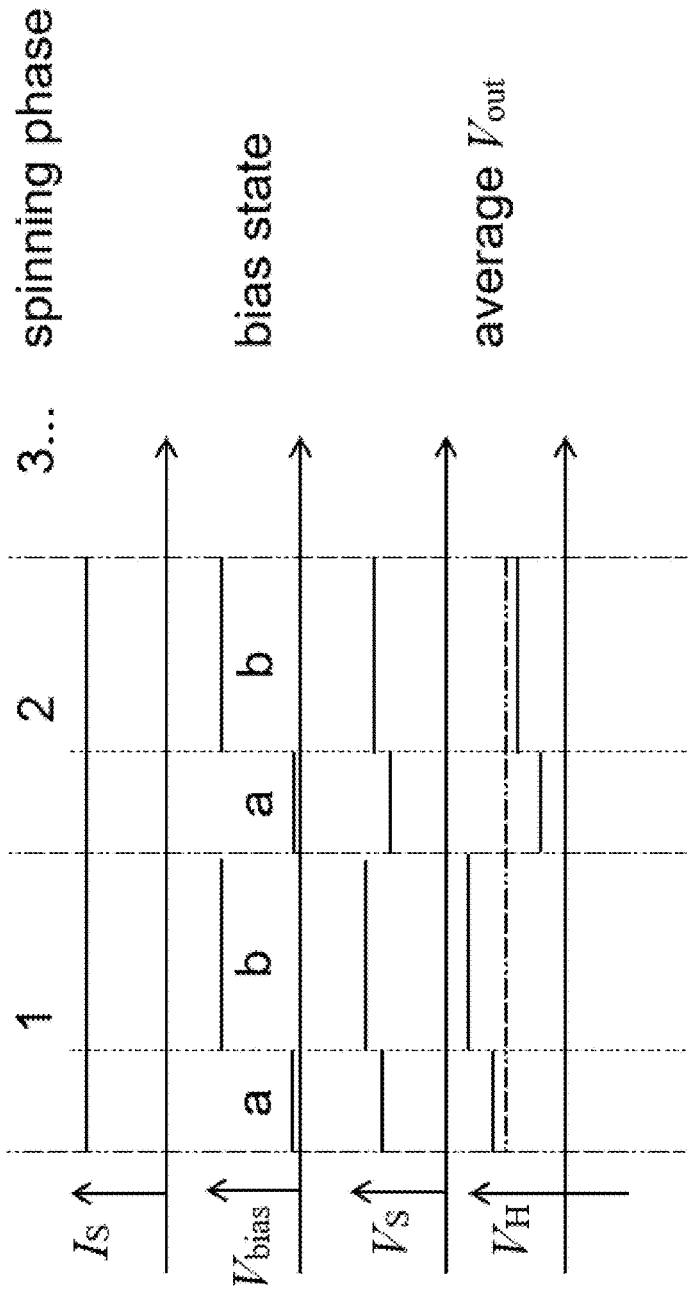
FIG. 7 represents a third operational timing diagram of the sensor calibration circuit.

FIG. 7 represents a third operational timing diagram 700 of the sensor calibration circuit. The third timing diagram 700 shows a second example of bias plus spinning operation.

In some example embodiments chopping is the fastest and spinning and modulation may be interleaved.

Various example embodiments of the sensor calibration circuit include: a magnetic field sensor integrated into a CMOS process, perhaps combined with other CMOS IP such as accurate temperature sensors, microprocessors, non-volatile memory, etc.; an accurate and stable position indicator for a permanent magnet electric device or motor that is actuated by electromagnets (e.g., for haptic feedback, speakers, camera focus modules, etc.); magnetic switches; and rotational encoders.

Applications also include semiconductor magnetic field sensors that are based on the Hall-Effect, including not only Hall plates, but also to other semiconductor devices like vertical Hall plates, lateral magneto-transistors or magneto-resistors. The sensor calibration circuit is not restricted to silicon, and thus other voltage-modulated electron or hole gases or plasmas may benefit as well.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A sensor calibration circuit, comprising:
   a controller configured to transmit a first bias signal to a sensor and receive a first output signal from the sensor in response;
   wherein the controller configured to transmit a second bias signal to the sensor and receive a second output signal from the sensor in response;
   wherein the sensor is a Hall-Effect sensor have a sensor resistance;
   wherein the output signals are Hall-Voltages (VH);
   wherein the controller is configured to calibrate the sensor using a magnetic flux density (B), a temperature (T), and a mechanical stress ($\sigma$) affecting the Hall-Effect sensor; and
   wherein the magnetic flux density (B), temperature (T), and mechanical stress ($\sigma$) are determined based on the sensor resistance and the first and second output signals.

2. The circuit of claim 1:
   wherein the controller is configured to calibrate a drift of the sensor based on the magnetic flux density (B), the temperature (T), and the mechanical stress ($\sigma$).

3. The circuit of claim 1:
   wherein the controller is configured to calibrate a detection sensitivity of the sensor based on the magnetic flux density (B), the temperature (T), and the mechanical stress ($\sigma$).

4. The circuit of claim 3:
   wherein the bias signals vary a charge carrier density within the sensor.

5. The circuit of claim 4:
   wherein calibration of the sensitivity is based on variations in the charge carrier density.

6. The circuit of claim 1:
   wherein the controller is configured to calibrate the sensor based on a mechanical stress ($\sigma$) equation;
   wherein the equation is $\sigma=[w_j(T)*V_{outj}]$;
   wherein j is either the first bias signal or the second bias signal;
   wherein $V_{outj}$ is either the first output signal or the second output signal; and
   wherein w is a weighting factor based on the temperature (T).

7. The circuit of claim 1:
   wherein the sensor is configured to receive the bias signals at a back-bias electrode; and
   wherein the back-bias electrode is coupled to a substrate containing the Hall-Effect sensor.

8. The circuit of claim 1:
   wherein the sensor is configured to receive the bias signals at a gate electrode.

9. The circuit of claim 1:
   wherein the sensor is configured to receive the bias signals at an input voltage electrode.

10. The circuit of claim 1:
    wherein the sensor is configured to receive the bias signals at an input current electrode.

11. The circuit of claim 1:
    wherein the sensor is a magnetic sensor.

12. The circuit of claim 1:
    wherein the controller is configured to generate the two Hall-Voltages (VH) by varying a bias voltage applied to a back-bias electrode coupled to the Hall Sensor.

13. The circuit of claim 1:
    wherein the controller is configured to generate the two Hall-Voltages (VH) by varying an input voltage (Vs) applied to the Hall Sensor.

14. The circuit of claim 1:
    wherein the controller is configured to generate the two Hall-Voltages (VH) by varying an input current (Is) applied to the Hall Sensor.

15. The circuit of claim 1:
    wherein the controller is configured to send the bias signals to the Hall-Effect sensor during a Hall-Effect sensor calibration phase.

16. The circuit of claim 1:
    wherein the controller is configured to turn off the bias signals during a Hall-Effect sensor operational phase.

17. The circuit of claim 1:
    wherein the controller is configured to calculate the magnetic flux density (B), the temperature (T), and the mechanical stress ($\sigma$) affecting the Hall-Effect sensor based only on the sensor resistance and the first and second output signals.

18. The circuit of claim 1:
    further comprising a spinning circuit having an input switch and an output switch;
    wherein the spinning circuit is first configured to apply a first current or voltage to one set of two pins on the Hall-Effect sensor and then measure a first output voltage;

wherein the spinning circuit is first configured to apply a second current or voltage to another set of two pins on the Hall-Effect sensor and then measure a second output voltage; and wherein the controller is configured to average the two output voltage measurements.

* * * * *